US012757538B2

(12) United States Patent
Ma

(10) Patent No.: US 12,757,538 B2
(45) Date of Patent: Oct. 6, 2026

(54) DISPLAY PANEL, AND LIGHT-EMITTING ELEMENTS AND BACKPLATE FOR DISPLAY PANEL

(71) Applicant: Xiamen Extremely PQ Display Technology Co., Ltd., Xiamen (CN)

(72) Inventor: Gang Ma, Xiamen (CN)

(73) Assignee: Xiamen Extremely PQ Display Technology Co., Ltd., Xiamen (CN)

( * ) Notice: Subject to any disclaimer, the term of this patent is extended or adjusted under 35 U.S.C. 154(b) by 657 days.

(21) Appl. No.: 18/114,284

(22) Filed: Feb. 27, 2023

(65) Prior Publication Data

US 2023/0387357 A1 Nov. 30, 2023

Related U.S. Application Data

(63) Continuation of application No. PCT/CN2023/072610, filed on Jan. 17, 2023.

(30) Foreign Application Priority Data

May 26, 2022 (CN) ........................ 202221308245.7

(51) Int. Cl.
*H10H 20/85* (2025.01)
*H10H 20/831* (2025.01)
*H10H 20/857* (2025.01)
*H10W 90/00* (2026.01)

(52) U.S. Cl.
CPC .... *H10H 20/8506* (2025.01); *H10H 20/8312* (2025.01); *H10H 20/857* (2025.01); *H10W 90/00* (2026.01)

(58) Field of Classification Search
CPC .............. H10H 20/857; H10H 20/0364; H01L 25/0753
See application file for complete search history.

(56) References Cited

U.S. PATENT DOCUMENTS

| | | | | |
|---|---|---|---|---|
| 7,002,180 | B2 * | 2/2006 | Oh | H10H 20/832 257/94 |
| 2017/0069609 | A1 * | 3/2017 | Zhang | H10H 20/855 |
| 2021/0183828 | A1 * | 6/2021 | Chae | H10W 72/071 |
| 2021/0193894 | A1 * | 6/2021 | You | H10H 20/857 |
| 2021/0202788 | A1 * | 7/2021 | You | H10H 20/01 |
| 2022/0223754 | A1 * | 7/2022 | Ahn | H10D 86/00 |

FOREIGN PATENT DOCUMENTS

| | | |
|---|---|---|
| CN | 107591338 A | 1/2018 |
| CN | 110268804 B | 8/2021 |
| CN | 110677991 B | 8/2021 |

OTHER PUBLICATIONS

"Melting Points of Metals & Pure Elements", American Elements (Year: 2025).*

* cited by examiner

*Primary Examiner* — Monica D Harrison
*Assistant Examiner* — Jacob T Nelson
(74) *Attorney, Agent, or Firm* — Hemisphere Law, PLLC

(57) ABSTRACT

A display panel, and light-emitting elements and a backplate used for display panels are provided. The backplate is provided thereon a first pad and a second pad serving as a repair pad. The first pad includes a first adhesive layer and a first bonding layer. The second pad includes a second adhesive layer and a second bonding layer. Each of the first and second bonding layers is a multi-layer structure including multiple single-metal layers. A bonding temperature of the first bonding layer is higher than that of the second bonding layer.

19 Claims, 8 Drawing Sheets

DISPLAY PANEL, AND LIGHT-EMITTING ELEMENTS AND BACKPLATE FOR DISPLAY PANEL

TECHNICAL FIELD

The disclosure relates to the technical fields of semiconductor devices and apparatuses, and particularly to a display panel, and light-emitting elements and a backplate for display panels.

BACKGROUND

With the characteristics of high luminous efficiency, long service life, safety and reliability, and environmental protection and energy saving, light-emitting diodes (LEDs) are particularly concerned in the fields of lighting and display. When LEDs are used for display, mass transfer of LED chips is needed, and the number of transferred LED chips is at the level of millions or even tens of millions. In order to achieve mass-production transfer and bonding yield of 99.9999%, the post-bonding repairing technology is the key. A current metal bonding process is to deposit a low melting point alloy solder, and then the solder is heated by heating and bonded to form metallurgically bonded connections.

In a micro-LED display backplate, a spacing between LED chips is very small, and generally less than 100 micrometers (pin). After a primary bonding, if poor transfer or a poor chip is found, a secondary repair bonding is required. During the secondary repair bonding process, a newly transferred LED chip (for repairing) needs to be performed with a repair metal bonding.

In a related art, the same kind of solder is deposited on pads used for primary bonding and repair bonding on a backplate, or the same kind of solder is deposited on LED chips (primary bonding chips and repair chips) used for a same backplate. In this way, in the repair bonding process, the newly transferred LED chip needs to be bonded, and a bonding temperature will make bonded points of primary bonded LED chips be melt again or partially, resulting in batch deviation of LED chips or damage to the bonded points. Accordingly, without effective repairing, it is very difficult to achieve the mass-production yield of 99.9999%.

SUMMARY

Technical Problem

Based on the above defects, it is necessary to provide a repairing technology capable of ensuring the transfer yield of LED chips.

Technical Solutions

In view of the defects existing in the aspects of transfer and repair of LED chips on a display panel in the related art, the disclosure provides a display panel, and light-emitting elements and a backplate for the display panel. A first bonding layer and a second bonding layer are respectively formed in a first pad and a second pad used for repairing on the backplate, the first bonding layer and the second bonding layer each include a plurality of single-metal layers, and a bonding temperature of the first bonding layer is higher than that of the second bonding layer. Therefore, it can be ensured that in a bonding process of a LED chip for repairing after a primary bonding is completed, heating of the second bonding layer would not affect LEDs which have been bonded, and a situation of LED batch deviation will not occur, thereby ensuring the transfer yield of LED chips.

According to an embodiment of the disclosure, a backplate for bonding light-emitting elements is provided. A surface of the backplate is disposed with a first pad and a second pad configured to bond the light-emitting elements, the second pad is configured as a repair pad, the first pad includes a first adhesive layer and a first bonding layer, the second pad includes a second adhesive layer and a second bonding layer, each of the first bonding layer and the second bonding layer is a multi-layer structure, the multiple-layer structure includes a plurality of single-metal layers, and a bonding temperature of the first bonding layer is higher than a bonding temperature of the second bonding layer.

In an embodiment, a number of the plurality of single-metal layers of the first bonding layer is equal to that of the plurality of single-metal layers of the second bonding layer; or, a number of the plurality of single-metal layers of the first bonding layer is different from that of the plurality of single-metal layers of the second bonding layer.

In an embodiment, the plurality of single-metal layers of the first bonding layer include at least two single-metal layers formed of different metals, the plurality of single-metal layers of the second bonding layer include at least two single-metal layers formed of different metals.

In an embodiment, the plurality of single-metal layers of each of the first bonding layer and the second bonding layer include sequentially stacked single-metal layers formed of a first metal and a second metal, and a melting point of the first metal is higher than that of the second metal.

In an embodiment, a thickness ratio of the single-metal layer formed of the first metal to the single-metal layer formed of the second metal is in a range of 1:10-10:1.

In an embodiment, the thickness ratio of the single-metal layer formed of the first metal to the single-metal layer formed of the second metal in the first bonding layer is a first thickness ratio, the thickness ratio of the single-metal layer formed of the first metal to the single-metal layer formed of the second metal in the second bonding layer is a second thickness ratio, the first thickness ratio is greater than the second thickness ratio.

In an embodiment, stacking orders of the first metal and the second metal in the plurality of single-metal layers of the first bonding layer are different from or the same as that of the first metal and the second metal in the plurality of single-metal layers of the second bonding layer.

In an embodiment, a forming material of at least one single-metal layer of the plurality of single-metal layers of the second bonding layer is different from a forming material of any single-metal layer of the plurality of single-metal layers of the first bonding layer.

In an embodiment, an area of orthographic projection of the first adhesive layer on the surface of the backplate is 1.15-2.5 times of an area of orthographic projection of the first bonding layer on the surface of the backplate; and/or, an area of orthographic projection of the second adhesive layer on the surface of the backplate is 1.15-2.5 times of an area of orthographic projection of the second bonding layer on the surface of the backplate.

In an embodiment, the first pad further includes a first connection electrode on a side of the first adhesive layer facing away from the first bonding layer, and an area of orthographic projection of the first adhesive layer on the surface of the backplate is 1.15-2.5 times of an area of orthographic projection of the first connection electrode on the surface of the backplate; and/or, the second pad further includes a second connection electrode on a side of the second adhesive layer facing away from the second bonding layer, and an area of orthographic projection of the second adhesive layer on the surface of the backplate is 1.15-2.5 times of an area of orthographic projection of the second connection electrode on the surface of the backplate.

According to another embodiment of the disclosure, a display panel is provided and includes:

- a backplate, disposed with a first pad and a second pad, wherein the first pad includes a first adhesive layer and a first alloy, the second pad includes a second adhesive layer and a bonding layer, the bonding layer is a multi-layer structure, and the multi-layer structure includes a plurality of single-metal layers; and
- light-emitting elements, secured on the backplate, wherein the light-emitting elements include a first light-emitting element, the first light-emitting element is soldered onto the first pad through the first alloy, and a temperature at which the first alloy starts to melt is higher than a bonding temperature of the bonding layer.

In an embodiment, the light-emitting elements further include a repair light-emitting element, and the repair light-emitting element is soldered onto at least one the second pad through a second alloy formed by the bonding layer.

In an Embodiment, Each of the Light-Emitting Elements Includes:

- a semiconductor structure, including a first semiconductor layer, a second semiconductor layer, and a light-emitting layer located between the first semiconductor layer and the second semiconductor layer, wherein the first semiconductor layer and the second semiconductor layer have opposite conductive types; and
- an electrode structure, including a first electrode and a second electrode, wherein the first electrode is electrically connected to the first semiconductor layer, the second electrode is electrically connected to the second semiconductor layer, and the light-emitting element is soldered onto the backplate through the electrode structure.

In an embodiment, an area of orthographic projection of the second adhesive layer on a surface of the backplate is 1.15-2.5 times of an area of orthographic projection of the bonding layer on the surface of the backplate.

According to still another embodiment of the disclosure, light-emitting elements for a display panel are provided. The light-emitting elements include: a first light-emitting element and a repair light-emitting element configured to replace the first light-emitting element on the display panel that cannot be normally lit; wherein each of the light-emitting elements includes a semiconductor structure and an electrode structure formed on a surface of the semiconductor structure, the electrode structure of the first light-emitting element includes a first soldering layer, the electrode structure of the repair light-emitting element includes a second soldering layer, each of the first soldering layer and the second soldering layer is a multi-layer structure, the multi-layer structure includes a plurality of single-metal layers, and a bonding temperature of the first soldering layer is higher than a bonding temperature of the second soldering layer.

Beneficial Effects

As described above, the display panel, and the light-emitting elements and the backplate used for display panels of the disclosure may have the following beneficial effects.

The backplate of the disclosure is disposed thereon the first pad and the second pad serving as a repair pad, the first pad includes the first adhesive layer and the first bonding layer, the second pad includes the second adhesive layer and the second bonding layer, both the first bonding layer and the second bonding layer are of a multilayer structure, and the multilayer structure includes a plurality of single-metal layers. The bonding temperatures of the first bonding layer and the second bonding layer are controlled by controlling contents (such as thickness ratio) of the metal layer of high melting point and the metal layer of low melting point in the plurality of single-metal layers, so that the bonding temperature of the first bonding layer is higher than that of the second bonding layer. The plurality of single-metal layers are formed on the first pad and the second pad by using an evaporation method, so that purity of each single-metal layer is ensured, and alloys with different melting points are conveniently formed subsequently. At the first bonding temperature, the first bonding layer is melted to form a first alloy to secure a LED chip to the first pad on the backplate; meanwhile, the second bonding layer on the second pad is melted to form a second alloy, and the melting temperature of the second alloy is lower than that of the first alloy. Therefore, when the second pad is heated to solder a LED chip for repairing, the first alloy on the first pad can not be melted, so that the stability of the LED chip on the first pad is ensured, the occurrence of batch deviation is prevented, and the yield of mass transfer of LED chip can be ensured.

The single-metal layers forming the first bonding layer and the single-metal layers forming the second bonding layer may be sequentially stacked single-metal layers formed by several same metals, and the stacking orders of the single-metal layers formed by each the same metal may be the same or different from each other. Or, the forming material of at least one single-metal layer in the second bonding layer is different from that of any one single-metal layer in the first bonding layer. Therefore, the selection range of single-metals for forming the first bonding layer and the second bonding layer is increased, and the design flexibility and adaptability of the pads are increased.

The light-emitting elements of the disclosure are divided into the first light-emitting element and the repair second light-emitting element, the electrode structure of the first light-emitting element includes the first soldering layer, the electrode structure of the repair light-emitting element includes the second soldering layer, both the first soldering layer and the second soldering layer are multi-layer structures, and the multi-layer structures each have the same structural features as those of the first pad and the second pad on the backplate. Therefore, when the light-emitting elements provided by the disclosure are employed, the first light-emitting element can be ensured not to be deviated when the repair light-emitting element is soldered, so that the transfer yield of light-emitting elements can be ensured.

The display panel of the disclosure employs the backplate of the disclosure, and the light-emitting elements have a good transfer yield, and therefore the display panel has a high mass-production yield.

DESCRIPTION OF REFERENCE NUMERALS

| | | | |
|---|---|---|---|
| 100 | backplate | 3011 | first light-emitting element |
| 101 | first pad | 3012 | repair light-emitting element |
| 1011 | first adhesive layer | 301-1 | substrate |
| 1012 | first bonding layer | 301-2 | first semiconductor layer |
| 1012-1 | first single-metal layer | 301-3 | active layer |
| 1012-2 | second single-metal layer | 301-4 | second semiconductor layer |
| 102 | second pad | 301-5 | insulating protective layer |
| 1021 | second adhesive layer | 301-6 | electrode structure |
| 1022 | second bonding layer | 301-61 | Ohmic contact layer |
| 1022-1 | third single-metal layer | 301-62 | first soldering layer |
| 1022-2 | fourth single-metal layer | 301-621 | sixth single-metal layer |
| 1022-3 | fifth single-metal layer | 301-622 | seventh single-metal layer |
| 1013 | first alloy | 3012-62 | second soldering layer |
| 1023 | second alloy | 3012-621 | eighth single-metal layer |
| 1014 | first connection electrode | 3012-622 | ninth single-metal layer |
| 1024 | second connection electrode | 3012-623 | tenth single-metal layer |
| 200 | display panel | 301-63 | third alloy |
| 201 | backplate | 301-64 | fourth alloy |
| 202 | light-emitting elements | 302 | backplate |
| 2021 | first light-emitting element | 3021 | first pad |
| 2022 | Repair light-emitting element | 3022 | second pad |
| 202-1 | substrate | 400 | display panel |
| 202-2 | first semiconductor layer | 401 | backplate |
| 202-3 | active layer | 4011 | first pad |
| 202-4 | second semiconductor layer | 4012 | second pad |
| 202-5 | insulating protective layer | 402 | light-emitting elements |
| 202-6 | electrode structure | | |
| 202-61 | first electrode | | |
| 202-62 | second electrode | | |

DETAILED DESCRIPTION OF EMBODIMENTS

Embodiments of the disclosure will be described below through specific examples, and those skilled in the art can readily understand other advantages and effects of the disclosure from the content disclosed in the description. The disclosure may be embodied and applied in various other embodiments, various modifications and changes may be made in the details of the description based on different viewpoints and applications without departing from the spirit of the disclosure.

Embodiment 1

Figure 1:
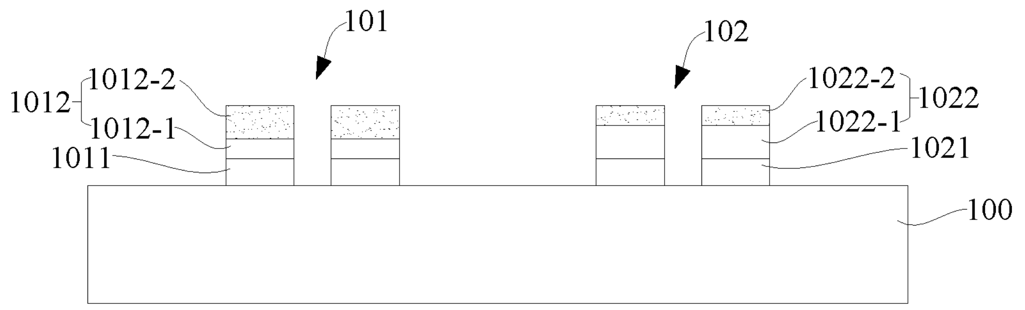
FIG. 1 illustrates a schematic structural view of a backplate used for bonding light-emitting elements according to embodiment 1 of the disclosure.

This embodiment provides a backplate used for bonding light-emitting elements. As illustrated in FIG. 1, a surface of the backplate 100 is disposed with a first pad 101 and a second pad 102 used for bonding light-emitting elements, respectively. The first pad 101 is used to bond a first light-emitting element 2021 (See FIG. 2), i.e., a primary light-emitting element, which is first transferred to the backplate 100. The second pad 102 is used as a repair pad and used to bond a repair light-emitting element 2022 (See FIG. 2) which replaces an abnormal primary light-emitting element. Referring to FIG. 1 again, the first pad 101 includes a first adhesive layer 1011 and a first bonding layer 1012, and the first bonding layer 1012 is a multi-layer structure. The second pad 102 includes a second adhesive layer 1021 and a second bonding layer 1022, and the second bonding layer 1022 is a multi-layer structure. In an embodiment, the multi-layer structure of each of the first bonding layer 1012 and the second bonding layer 1022 includes multiple (i.e., more than one) single-metal layers, for example, two, three, four or even more single-metal layers. The number of the single-metal layers may be flexibly set according to design requirements of the first pad 101 and the second pad 102, and the number of the single-metal layers of the first bonding layer 1012 is the same as or different from the number of the single-metal layers of the second bonding layer 1022.

Referring to FIG. 1, in an illustrated embodiment, the first bonding layer 1012 includes a first single-metal layer 1012-1 and a second single-metal layer 1012-2. The first single-metal layer 1012-1 and the second single-metal layer 1012-2 are single-metal layers formed of different single-metals, and a melting point of the single-metal forming the first single-metal layer 1012-1 is higher than that of the single-metal forming the second single-metal layer 1012-2. For example, the first single-metal layer 1012-1 is a metal layer of tin (Sn), and the second single-metal layer 1012-2 is a metal layer of indium (In). The second bonding layer 1022 includes the same number of single-metal layers as that of the first bonding layer 1012, e.g., includes a third single-metal layer 1022-1 and a fourth single-metal layer 1022-2. In an illustrated embodiment, the third single-metal layer 1022-1 and the first single-metal layer 1012-1 are single-metal layers formed of the same single-metal, the fourth single-metal layer 1022-2 and the second single-metal layer 1012-2 are single-metal layers formed of the same single-metal; and for example, the third single-metal layer 1022-1 is also a metal layer of Sn, and the fourth single-metal layer 1022-2 is also a metal layer of In. Moreover, the single-metal layers formed of each same single-metal have the same stacking order in the first bonding layer 1012 and the second bonding layer 1022, that is, the second single-metal layer 1012-2 as illustrated in FIG. 1 is located over the first single-metal layer 1012-1, and the fourth single-metal layer 1022-2 is located over the third single-metal layer 1022-1.

In an embodiment, a thickness ratio of the single-metal layer of high melting point to the single-metal layer of low melting point is in a range of 1:10~10:1. In order to obtain different soldering temperatures, the thickness ratio of the single-metal layer of high melting point to the single-metal layer of low melting point in the first bonding layer 1012 is a first thickness ratio, the thickness ratio of the single-metal layer of high melting point to the single-metal layer of low melting point in the second bonding layer 1022 is a second thickness ratio, and the first thickness ratio is greater than the first thickness ratio. That is, the first thickness ratio of the first single-metal layer 1012-1 to the second single-metal layer 1012-2 in the first bonding layer 1012 is different from the second thickness ratio of the third single-metal layer 1022-1 to the fourth single-metal layer 1022-2, and the first thickness ratio of the first single-metal layer 1012-1 to the second single-metal layer 1012-2 is greater than the second thickness ratio of the third single-metal layer 1022-1 to the fourth single-metal layer 1022-2. In exemplary embodiments, the first thickness ratio is 10:1, and the second thickness ratio is 4:6; or, the first thickness ratio is 4:6, and the second thickness ratio is 1:10; or, the first thickness ratio is 8:1, and the second thickness ratio is 2:1; or, the first thickness ratio is 5:7, and the second thickness ratio is 3:8. The above exemplary different thickness ratios represent different contents of different single-metal layers in the first bonding layer 1012 and the second bonding layer 1022. Since different metals have different melting points, the first bonding layer 1012 and the second bonding layer 1022 can be controlled to have different bonding temperatures by controlling to be with different thickness ratios and controlling the content of the single-metal layer of high melting point in the first bonding layer 1012 to be greater than that in the second bonding layer 1022, and the bonding temperature of the second bonding layer 1022 is lower than that of the first bonding layer 1012.

Figure 2:
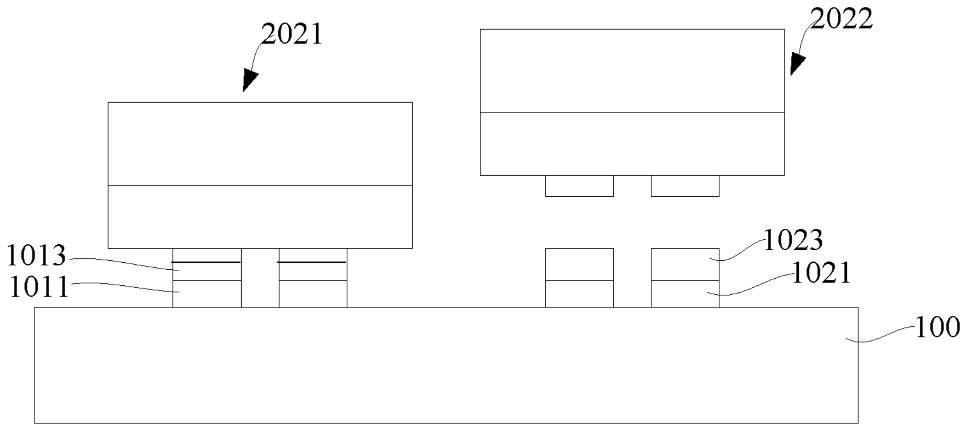
FIG. 2 illustrates a schematic view of soldering LED chips on the backplate illustrated in FIG. 1.

As described above, the first bonding layer 1012 and the second bonding layer 1022 have the above-described structural features, which make the first bonding layer 1012 and the second bonding layer 1022 have different bonding temperatures, and the bonding temperature of the second bond layer 1022 is lower than that of the first bond layer 1012. As illustrated in FIG. 2, the first thickness ratio of the first single-metal layer 1012-1 to the second single-metal layer 1012-2 in the first bonding layer 1012 being 10:1 and the second thickness ratio of the third single-metal layer 1022-1 to the fourth single-metal layer 1022-2 in the second bonding layer 1022 being 4:6 is taken as an example, during soldering light-emitting elements onto the backplate 100 as illustrated in FIG. 1, the first light-emitting element 2021 is first soldered, and at this time, the first bonding layer 1012 of the first pad 101 has a relatively high temperature at which it starts to melt, i.e., 200 degrees Celsius (° C.), and therefore after the first light-emitting element 2021 is transferred onto the backplate 100 once, a thermal bonding is performed and the backplate 100 is heated up to about 260° C., so as to ensure the first bonding layer 1012 of the first pad 101 is completely melted to form a first alloy 1013 and thereby achieve a sufficient thermal bonding of the first light-emitting element 2021. A melting temperature of the first alloy 1013 formed by heating the first bonding layer 1012 is about 200° C. Since the second bonding layer 1022 of the second pad 102 has a lower temperature at which it starts to melt, the second bonding layer 1022 is also completely melted and forms a second alloy 1023 in the heating process, in view of the above structural designs of the second bonding layer 1022 and the first bonding layer 1021, the second alloy 1023 formed by the second bonding layer 1022 has a lower melting temperature than that of the first alloy 1013. In an illustrated embodiment, the melting temperature of the second alloy 1023 is about 125° C. Therefore, after the repair light-emitting element 2022 is transferred to the backplate 100, thermal bonding is performed again, and at this time, the backplate 100 is heated up to about 150° C. but below 200° C. to ensure that the second alloy 1023 is completely melted while the first alloy 1013 of the first pad 101 is not melted. Therefore, it is ensured that the first light-emitting element 2021 will not be deviated or fall off, and the repair light-emitting element 2022 can be fully bonded to the backplate 100.

In an embodiment, after the first light-emitting element 2021 is transferred to the backplate 100 once, thermal bonding is performed, and the backplate 100 is heated in a local heating manner, that is, only the first pad 101 on which the first light-emitting element 2021 is transferred is heated to about 260° C. It is ensured that the first bonding layer 1012 of the first pad 101 is completely melted to form the first alloy 1013, thereby achieving sufficient thermal bonding of the first light-emitting element 2021. A melting temperature of the first alloy 1013 formed by heating the first bonding layer 1012 is about 200° C. In the process of bonding the first light-emitting element 2021, the second pad 102 is not heated or suffers from a relatively small degree of heating, so that the second bonding layer 1022 of the second pad 102 is not melted or softened, or not completely melted, and thus the structure of multiple single-metal layers or a structure of partial multiple single-metal layers is still maintained. When it is needed to bond the repair light-emitting element 2022, after the repair light-emitting element 2022 is transferred to the backplate 100, thermal bonding is performed again, and similarly, local heating is performed to heat the second pad 102 on which the repair light-emitting element 2022 is transferred, and the backplate 100 is heated up to about 150° C. but below 200° C. At this time, the second bonding layer 1022 can be ensured to be completely melted, but the first alloy 1013 of the first pad 101 is not melted, thereby ensuring that the first light-emitting element 2021 will not be deviated or fall off, while the repair light-emitting element 2022 can be ensured to be fully bonded to the backplate 100.

In addition, in an exemplary embodiment, the multiple single-metal layers of each of the first bonding layer 1012 and the second bonding layer 1022 are formed by an evaporation method, and such evaporation method uses single-metals as evaporation metal sources to obtain single-metal layers on the adhesive layer (e.g., the first adhesive layer 1011 or the second adhesive layer 1021). By selecting different evaporation metal sources to obtain different single-metal layers and accurately controlling thicknesses of the single-metal layers, multiple single-metal layers meeting the above structural requirements can be obtained.

Figure 3A:
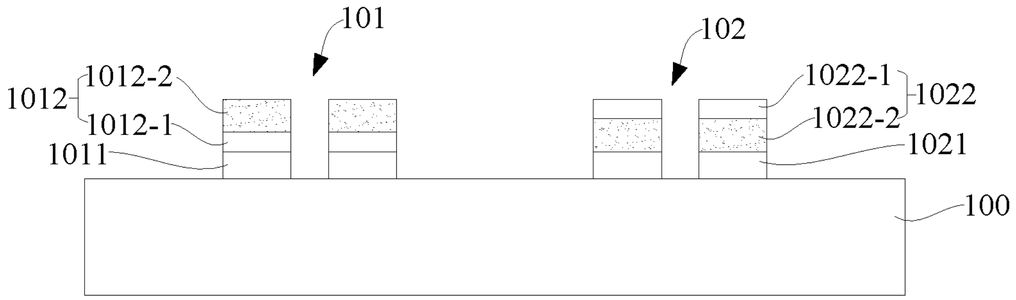
FIG. 3A illustrates a schematic view of another backplate used for bonding light-emitting elements according to the embodiment 1 of the disclosure.

In an embodiment, the first bonding layer 1012 and the second bonding layer 1022 include the same number of single-metal layers formed of same single-metals, and the single-metal layers formed of the same single-metal have different stacking orders in the first bonding layer 1012 and the second bonding layer 1022. As illustrated in FIG. 3A, the third single-metal layer 1022-1 of the second bonding layer 1022 and the first single-metal layer 1012-1 of the first bonding layer 1012 are single-metal layers formed of a same single-metal, the fourth single-metal layer 1022-2 of the second bonding layer 1022 and the second single-metal layer 1012-2 of the first bonding layer 1012 are single-metal layers formed of another same single-metal. As described above, the first single-metal layer 1012-1 and the third single-metal layer 1022-1 may be metal layers of Sn, respectively; and the second single-metal layer 1012-2 and the fourth single-metal layer 1022-2 may be metal layers of In, respectively. However, in the illustrated embodiment, as shown in FIG. 3A, the third single-metal layer 1022-1 and the fourth single-metal layer 1022-2 of the second bonding layer 1022 have stacking orders different from that of the first single-metal layer 1012-1 and the second single-metal layer 1012-2 of the first bonding layer 1012; that is, the second single-metal layer 1012-2 as shown in FIG. 3A is located over the first single-metal layer 1012-1, and the fourth single-metal layer 1022-2 is located below the third single-metal layer 1022-1. Such stacking orders of the multiple single-metal layers can also meet the requirement of different bonding temperatures, while increasing the design flexibility of the pads.

As described above, the multiple metal layers of the first bonding layer 1012 and the multiple metal layers of the second bonding layer 1022 are single-metal layers formed of same metals. It can be understood that, as per a eutectic theory of metals, the first bonding layer 1012 and the second bonding layer 1022 may include single-metal layers formed of different metals. For example, a forming material of at least one single-metal layer of the second bonding layer 1022 is different from a forming material of any single-metal layer of the first bonding layer 1012. In exemplary embodiments, the first bonding layer 1012 includes a Sn layer and a zinc (Zn) layer, and the second bonding layer 1022 includes a bismuth (Bi) layer and a Sn layer; or, the first bonding layer 1012 includes a silver (Ag) layer and a Zn layer, and the second bonding layer 1022 includes a Bi layer and a Sn layer; as long as the bonding temperature of the first bonding layer 1012 is higher than the bonding temperature of the second bonding layer 1022.

Figure 3B:
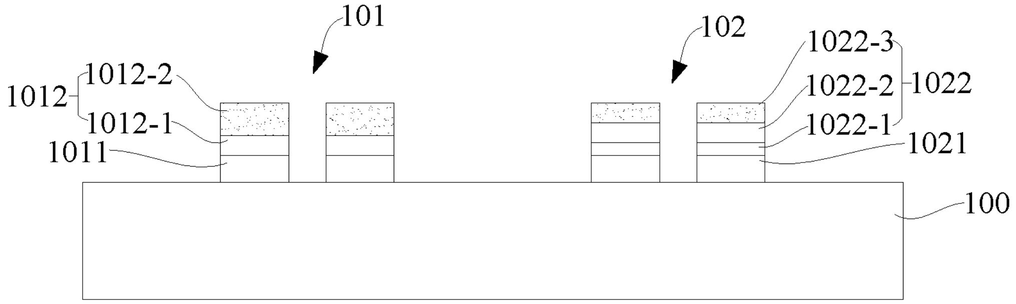
FIG. 3B illustrates a schematic view of still another backplate used for bonding light-emitting elements according to the embodiment 1 of the disclosure.

In another embodiment, the first bonding layer 1012 and the second bonding layer 1022 have different numbers of single-metal layers, and the single-metal layers of the first bonding layer 1012 and single-metal layers of the second bonding layer 1022 may be multiple single-metal layers formed of same single-metals or multiple single-metal layers formed of different single-metals. As illustrated in FIG. 3B, the first bonding layer 1012 includes a first single-metal layer 1012-1 and a second single-metal layer 1012-2, the second bonding layer 1022 includes a third single-metal layer 1022-1, a fourth single-metal layer 1022-2 and a fifth single-metal layer 1022-3. In an exemplary embodiment, the first single-metal layer 1012-1 and the second single-metal layer 1012-2 may be a Sn layer and an Ag layer, respectively; the third single-metal layer 1022-1, the fourth single-metal layer 1022-2 and the fifth single-metal layer 1022-3 are a Sn layer, an In layer and a Bi layer, respectively.

In some embodiments, the single-metal layers of the first bonding layer 1012 and the single-metal layers of the second bonding layer 1022 may be selected from combinations listed in Table 1 below, and the stacking orders may be changed according to actual needs.

TABLE 1

| single-metal layers' combinations of first and second bonding layers | | |
|---|---|---|
| Serial number | First bonding layer | Second bonding layer |
| 1 | Sn + In | Sn + In |
| 2 | Sn + Bi | Sn + In |
| 3 | Sn + Bi | Sn + Bi + In |
| 4 | Sn + Ag | Sn + Bi |
| 5 | Sn + Zn | Sn + Zn + Bi |

As illustrated in the above Table 1, the optional single-metal layers' combinations of the first bonding layer 1012 and the second bonding layer 1022 are merely illustrative. Although the first bonding layer 1012 only shows each combination with two single-metal layers, it can be understood that the first bonding layer 1012 may also include three or more single-metal layers. Similarly, the second bonding layer 1022 may also include more than three single-metal layers, and the multiple single-metal layers of each of the first bonding layer 1012 and the second bonding layer 1022 may be arbitrarily combined under the condition that the bonding temperatures are satisfied.

Figure 3C:
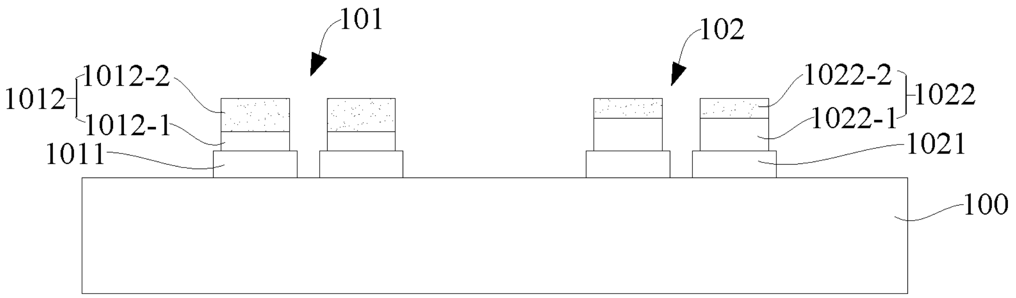
FIG. 3C illustrates a schematic view of further another backplate used for bonding light-emitting elements according to the embodiment 1 of the disclosure.

In an embodiment, the first adhesive layer 1011 and the first bonding layer 1012 of the first pad 101 have different areas of orthographic projections on the surface of the backplate 100. The area of orthographic projection of the first adhesive layer 1011 on the surface of the backplate 100 is denoted as S1, and the area of orthographic projection of the first bonding layer 1012 on the surface of the backplate 100 is denoted as S2. Specifically, S1>S2. More specifically, S1 is 1.15-2.5 times of S2. FIG. 3C illustrates a width of the first adhesive layer 1011 is greater than a width of the first bonding layer 1012. It can be understood that, the orthographic projection of the first bonding layer 1012 on the surface of the backplate 100 falls within the orthographic projection of the first adhesive layer 1011 on the backplate 100. In an embodiment, the second adhesive layer 1021 and the second bonding layer 1022 of the second pad 102 have different areas of orthographic projection on the surface of the backplate 100, the area of orthographic projection of the second adhesive layer 1021 on the surface of the backplate 100 is denoted as S3, and the area of orthographic projection of the second bonding layer 1022 on the surface of the backplate 100 is denoted as S4. Specifically, S3>S4. More specifically, S3 is 1.15-2.5 times of S4. FIG. 3C illustrates a width of the second adhesive layer 1021 is greater than a width of the second bonding layer 1022. It can be understood that, the orthographic projection of the second bonding layer 1022 on the surface of the backplate 100 falls within the orthographic projection of the second adhesive layer 1021 on the surface of the backplate 100. A ratio of S1 to S2 and a ratio of S3 to S4 may be the same or different from each other. For example, S1 is 1.2 times of S2, and S3 is 2.0 times of S4; or, S1 is 2.2 times of S2, and S3 is 1.5 times of S4. The above exemplary ratios are only examples, and cannot be construed as limiting the disclosure. Materials of the first adhesive layer 1011 and the second adhesive layer 1012 may be chromium (Cr), nickel (Ni), etc., and the first adhesive layer 1011 is set to be larger than the first bonding layer 1012 (the second adhesive layer 1021 is set to be larger than the second bonding layer 1022), which may provide a better soldering effect and may relieve the problem of the first bonding layer 1012 (or the second bonding layer 1022) melting and overflowing to the periphery during the soldering process.

Figure 3D:
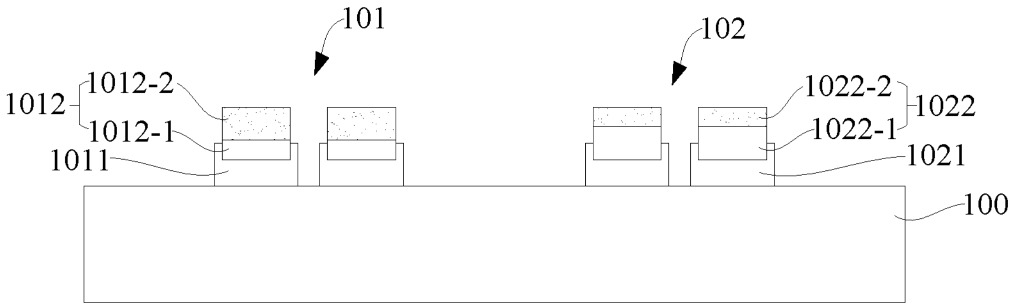
FIG. 3D illustrates a schematic view of even another backplate used for bonding light-emitting elements according to the embodiment 1 of the disclosure.

In an embodiment, as illustrated in FIG. 3D, what is different from the illustration of FIG. 3C is that: a side of the first adhesive layer 1011 close to the first bonding layer 1012 extends to a side surface of the first bonding layer 1012. In other words, the first adhesive layer 1011 is formed with a groove, and the first bonding layer 1012 is disposed in the groove. Similarly, a side of the second adhesive layer 1021 close to the second bonding layer 1022 extends to a side surface of the second bonding layer 1022. In other words, the second adhesive layer 1021 is formed with a groove, and the second bonding layer 1022 is disposed in the groove. A depth of the groove formed on the first adhesive layer 1011 may be smaller than or equal to a thickness of a nearest metal layer contacted with the groove in the multiple single-metal layers of the first bonding layer 1012. A depth of the groove formed on the second adhesive layer 1021 may be smaller than or equal to a thickness of a nearest metal layer contacted with the groove in the multiple single-metal layers of the second bonding layer 1022. The depth of the groove formed on the first adhesive layer 1011 may be the same or different from the depth of the groove formed on the second adhesive layer 1021. Compared with the embodiment illustrated by FIG. 3C, the embodiment illustrated by FIG. 3D may further relieve the problem of the first bonding layer 1012 (or the second bonding layer 1022) melting and overflowing to the periphery during the soldering process.

Figure 3E:
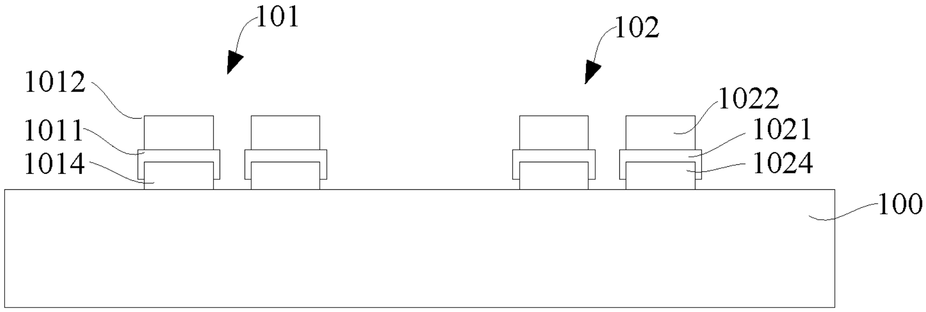
FIG. 3E illustrates a schematic view of even further another backplate used for bonding light-emitting elements according to the embodiment 1 of the disclosure.

In an embodiment, the first pad 101 further includes a first connection electrode 1014 disposed on a side of the first adhesive layer 1011 facing away from the first bonding layer 1012, and the second pad 102 further includes a second connection electrode 1024 disposed on a side of the second adhesive layer 1021 facing away from the second bonding layer 1022. The first connection electrode 1014 and the second connection electrode 1024 are electrically connected to an internal circuit of the backplate 100, individually. The first adhesive layer 1011 may be used to block the first connection electrode 1014 from the first bonding layer 1012, and the second adhesive layer 1021 may be used to block the second connection electrode 1024 from the second bonding layer 1022, thereby functioning as solder resists. As illustrated in FIG. 3E, the area of orthographic projection of the first adhesive layer 1011 on the surface of the backplate 100 is denoted as S1, the area of orthographic projection of the first bonding layer 1012 on the surface of the backplate 100 is denoted as S2, the area of orthographic projection of the second adhesive layer 1021 on the surface of the backplate 100 is denoted as S3, and the area of orthographic projection of the second bonding layer 1022 on the surface of the backplate 100 is denoted as S4. An area of orthographic projection of the first connection electrode 1014 on the surface of the backplate 100 is denoted as S5, and an area of orthographic projection of the second connection electrode 1024 on the surface of the backplate 100 is denoted as S6. In an exemplary embodiment, S1>S5; and more specifically, S1 is 1.15-2.5 times of S5. In another exemplary embodiment, S3>S6; and more specifically, S3 is 1.15-2.5 times of S6. A ratio of S1 to S5 may be the same or different from a ratio of S3 to S6. For example, S1 is 1.8 times of S5, and S3 is 2.4 times of S6; or, S1 is 2.2 times of S5, and S3 is 1.2 times of S6. The above exemplary ratios are only examples, and cannot be construed as limiting the disclosure. S2 may be equal to or unequal to S5, it may be that S2 is greater than S5, or S2 is smaller than S5, and the embodiment does not give a limitation to them. S4 may be equal to or unequal to S6, it may be that S4 is greater than S6, or S4 is smaller than S6, and the embodiment does not give a limitation to them.

Referring to FIG. 3E again, a side of the first adhesive layer 1011 close to the first connection electrode 1014 extends to a side surface of the first connection electrode 1014, and a side of the second adhesive layer 1021 close to the second connection electrode 1024 extends to a side surface of the second connection electrode 1024; so that the first connection electrode 1014 and the second connection electrode 1024 can be better isolated, and a better solder resist effect can be achieved. An extending height of the first adhesive layer 1011 towards the first connection electrode 1014 may be smaller than a thickness of the first connection electrode 1014, or equal to the thickness of the first connection electrode 1014. An extending height of the second adhesive layer 1021 towards the second connection electrode 1024 may be smaller than a thickness of the second connection electrode 1024, or equal to the thickness of the second connection electrode 1024. The embodiment does not give a limitation to them.

Embodiment 2

Figure 4A:
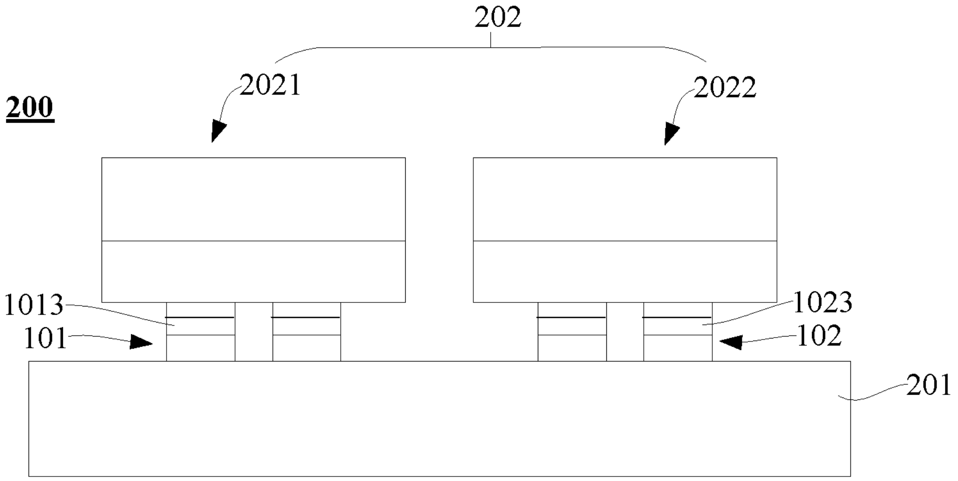
FIG. 4A illustrates a schematic structural view of a display panel according to embodiment 2 of the disclosure.

This embodiment provides a display panel. As illustrated in FIG. 4A, the display panel 200 of this embodiment includes a backplate 201 and light-emitting elements 202 disposed on the backplate 201. Specifically, in FIG. 4A, the backplate 201 includes a first pad 101 and a second pad 102. The first pad 101 includes a first adhesive layer 1011 (see FIG. 1) and a first alloy 1013. The light-emitting elements 201 include a first light-emitting element 2021 secured on the first pad 101. The first light-emitting element 2021 is soldered onto the first pad 101 through the first alloy 1013. In combination with the description of the above embodiment 1, the first light-emitting element 2021 is secured on the first pad 101 at a first bonding temperature through the first alloy 1013 formed after heating the first bonding layer 1012. In an embodiment, the first bonding layer 1012 includes multiple single-metal layers, and the multiple single-metal layers are formed by metals of different melting points. For example, the first bonding layer 1012 has structural features same as that of the first bonding layer 1012 described in above embodiment 1. During heating the backplate 201 to solder the first light-emitting element 2021, the multiple single-metal layers of the first bonding layer 1012 are melted to form the first alloy 1013 and thereby secure the first light-emitting element 2021 onto the first pad 101 on the backplate 201. In an alternative embodiment, a uniform alloy solder is formed over the first adhesive layer 1011, and during heating the backplate 201 to solder the first light-emitting element 2021, the alloy solder is melted to form the first alloy 1013 and thereby secure the first light-emitting element 2021 onto the first pad 101 on the backplate 201.

In an illustrated embodiment, the second pad 102 includes a second adhesive layer 1021 (see FIG. 1) and a second bonding layer 1022. The second bonding layer 1022 is a multi-layer structure, and the multi-layer structure includes multiple single-metal layers, for example, two, three or even more single-metal layers; and metals for forming the multiple single-metal layers may be the metals shown in the Table 1 of the above embodiment 1. The second bonding layer 1022 formed by the multiple single-metal layers has a lower melting temperature than the first alloy 1013.

In combination with the illustrations of FIG. 3C and FIG. 3D of the above embodiment 1, a relationship between the area S3 of orthographic projection of the second adhesive layer 1021 on the surface of the backplate 100 and the area S4 of orthographic projection of the second bonding layer 1022 on the surface of the backplate 100 may be that S3>S4. More specifically, S3 is 1.15-2.5 times of S4, so that better soldering effect can be provided, and the problem that the second bonding layer 1022 is melted and overflows to the periphery in the process of soldering the repair light-emitting element 2022 to the backplate 100 can be relieved.

Referring to FIG. 4A again, the light-emitting elements 202 of the display panel 200 may further include at least one repair light-emitting element 2022. The repair light-emitting element 2022 is configured (i.e., structured and arranged) to replate a first light-emitting element 2021 that is damaged or cannot be lit normally on the backplate 201. The at least one repair light-emitting element 2022 is soldered onto at least one second pad 102 through the second alloy 1023. As described above, sine the second bonding layer 1022 has a lower melting temperature than the first alloy 1013, that is, a second soldering temperature of the second bonding layer 1022 is lower than a temperature at which the first alloy 1013 starts to melt, and therefore after transferring the at least one repair light-emitting element 2022 to the at least one second pad 102, the at least one second pad 102 is heated at the second bonding temperature to make the multiple single-metal layers of the second bonding layer 1022 completely melt, the melted second bonding layer 1022 forms the second alloy 1023, and after stopping heating, the second alloy 1023 secures the repair light-emitting element 2022 onto the second pad 102. During the process, the second pad 102 on which no repair light-emitting element 202 is transferred still remain at a state of the second bonding layer 1022 having the multi-layer structure. Accordingly, the second pad 102 on the backplate 201 of the display panel 200 has two states. In particular, in one state, the second pad 102 includes the second adhesive layer 1021, and the second bonding layer 1022 of multi-layer structure. In the other state, the second pad 102 includes the second adhesive layer 1021 and the second alloy 1023. During soldering the repair light-emitting element 2022, the first alloy 1023 is not softened or melted, and therefore the first light-emitting element 2021 on the first pad 101 does not have the risk of deviating or falling off, and the stability of the first light-emitting element 2021 is not affected, thereby ensuring an overall yield of the display panel 200.

In an embodiment, the second pad 102 includes the second adhesive layer 1021 (see FIG. 1) and the second alloy 1023, and the second alloy 1023 is a uniform alloy solder formed on the second adhesive layer 1021. The uniform alloy solder has a melting temperature lower than that of the first alloy 1013, and therefore during bonding the repair light-emitting element 2022, the first alloy 1013 is not softened or melted, which can ensure that the first light-emitting element 2021 on the first pad 101 will not be deviated or fall off, and the stability of the first light-emitting element 2021 will not be affected, thereby ensuring the overall yield of the display panel 200.

The above described second bonding layer 1022 of multi-layer structure has a temperature at which it starts to melt higher than that of the second alloy 1023 formed by the uniform alloy solder, and therefore, during soldering the first light-emitting element 2021, a better thermal stability is achieved, and the second bonding layer 1022 will not be softened or melted resulting from the thermal bonding of the first light-emitting element 2021, thereby ensuring the integrity and stability of the second pad 102.

Figure 4B:
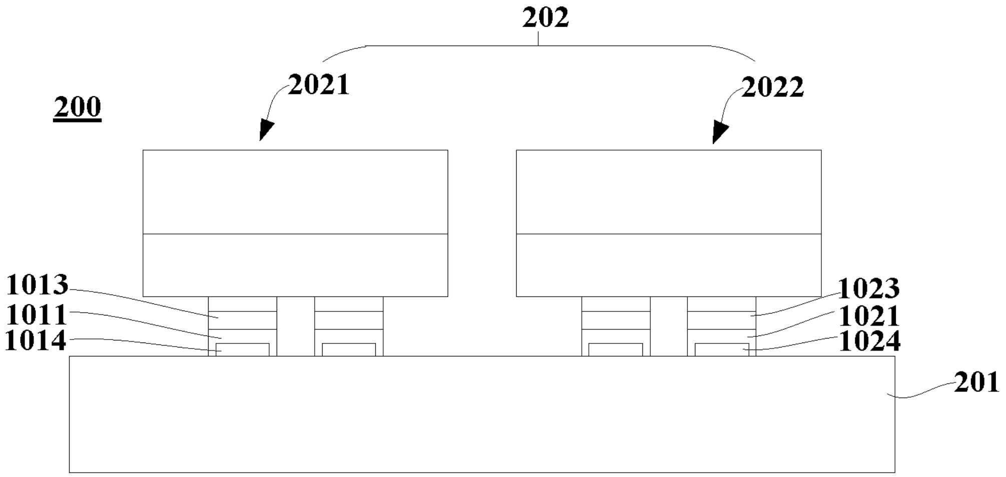
FIG. 4B illustrates a schematic structural view of another display panel according to the embodiment 2 of the disclosure.

In combination with the description of the above embodiment 1, FIG. 4B illustrates that the first pad 101 further includes a first connection electrode 1014 disposed on a side of the first adhesive layer 1011 facing away from the first bonding layer 1012, and the second pad 102 further includes a second connection electrode 1024 disposed on a side of the second adhesive layer 1021 facing away from the second bonding layer 1022. The area S1 of orthographic projection of the first adhesive layer 1011 on the surface of the backplate 100 is greater than the area S5 of orthographic projection of the first connection electrode 1014 on the surface of the backplate 100, the area S3 of orthographic projection of the second adhesive layer 1021 on the surface of the backplate 100 is greater than the area S6 of orthographic projection of the second connection electrode 1024 on the surface of the backplate 100, and the details can refer to the description associated with FIG. 3E in the foregoing embodiment 1.

Figure 5:
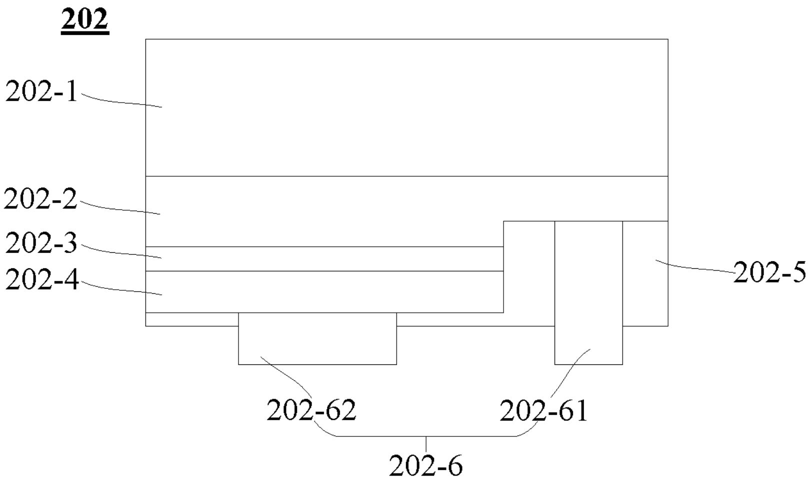
FIG. 5 illustrates a schematic structural view of a light-emitting element on the display panel illustrated in FIG. 4A.

As illustrated in FIG. 5, in an illustrated embodiment, the light-emitting element 202 is a light-emitting diode (LED) chip. The LED chip includes a substrate 202-1, and a first semiconductor layer 202-2, a second semiconductor layer 202-4 and an active layer 202-3 all formed on the substrate 202-1. The second semiconductor layer 202-4 has a conductive type opposite to that of the first semiconductor layer 202-2. The active layer 202-3 is arranged between the first semiconductor layer 202-2 and the second semiconductor layer 202-4. The active layer 202-3 is a light-emitting layer of the light-emitting element 202. The light-emitting element 202 further includes an insulating protective layer 202-5 formed on a surface of the light-emitting element 202. The first semiconductor layer 202-2 may be a N-type semiconductor layer, and the second semiconductor layer 202-4 is a P-type semiconductor layer. Alternatively, the first semiconductor layer 202-2 is a P-type semiconductor layer, and the second semiconductor layer 202-4 is a N-type semiconductor layer. In an embodiment, the first semiconductor layer 202-2 may be a N-type GaN layer, the active layer 202-3 is a quantum well layer, and the second semiconductor layer 202-4 is a P-type GaN layer. For example, the first semiconductor layer 202-2 is a N-type GaN layer, e.g., Si-doped GaN layer, the active layer 202-3 is a multiple quantum well (MQW) of InGaN/GaN, and the second semiconductor layer 202-4 is a P-type GaN layer, e.g., Mg-doped GaN layer.

Referring to FIG. 5 again, the LED chip may further include an electrode structure 202-6, and the light-emitting element 202 is secured on the first pad 101 or the second pad 102 on the backplate 201 through the electrode structure 202-6. The electrode structure 202-6 includes a first electrode 202-61 and a second electrode 202-62. The first electrode 202-61 is connected to the first semiconductor layer 202-2, and the second electrode 202-62 is connected to the second semiconductor layer 202-4. As illustrated in FIG.

5, the first semiconductor layer 202-2 may be formed with a mesa, and metal materials such as gold (Au), silver (Ag), aluminium (Al), copper (Cu) and Zn are deposited on the mesa to form the first electrode 202-61. Similarly, the second semiconductor layer 202-4 is deposited metal materials such as Au, Ag, Al and Cu thereon, to form the second electrode 202-62. It can be understood that, the second semiconductor layer 202-4 may be further provided a transparent conductive layer, a current blocking layer or the like thereon.

Embodiment 3

Figure 6A:
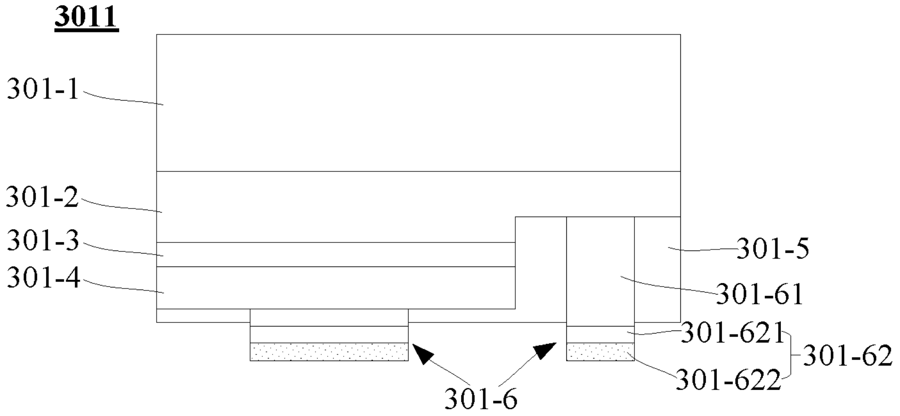
FIG. 6A illustrates a schematic structural view of a first light-emitting element of light-emitting elements according to embodiment 3 of the disclosure.
Figure 6B:
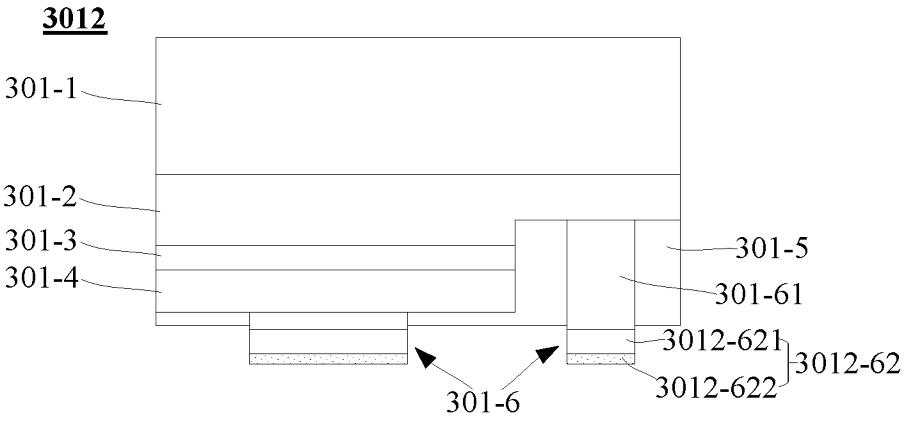
FIG. 6B illustrates a schematic structural view of a repair light-emitting element of the light-emitting elements according to the embodiment 3 of the disclosure.

This embodiment provides light-emitting elements used for a display panel. As illustrated in FIG. 6A and FIG. 6B, the light-emitting elements include a first light-emitting element 3011 serving as a primary light-emitting element of the display panel, and a repair light-emitting element 3012 configured for replacing the first light-emitting element 3011 which cannot be lit normally on the display panel.

In an illustrated embodiment, each of the first light-emitting element 3011 and the repair light-emitting element 3012 is a LED chip. As illustrated in FIG. 6A and FIG. 6B, the LED chip includes a substrate 301-1, and a first semiconductor layer 301-2, a second semiconductor layer 301-4 and an active layer 301-3 all formed on the substrate 301-1. The first semiconductor layer 301-2 and the second semiconductor layer 301-4 have opposite conductive types. The active layer 301-3 is located between the first semiconductor layer 301-2 and the second semiconductor layer 301-4. The active layer 301-3 is a light-emitting layer of the LED chip. The LED chip further includes an insulating protective layer 301-5 formed on a surface of the LED chip. The first semiconductor layer 301-2 may be a N-type semiconductor layer, and the second semiconductor layer 301-4 correspondingly is a P-type semiconductor layer. Alternatively, the first semiconductor layer 301-2 is a P-type semiconductor layer, and the second semiconductor layer 301-4 is a N-type semiconductor layer. In an embodiment, the first semiconductor layer 301-2 may be a N-type GaN layer, the active layer 301-3 is a quantum well layer, and the second semiconductor layer 301-4 is a P-type GaN layer. For example, the first semiconductor layer 301-2 is a N-type GaN layer, e.g., Si-doped GaN layer, the active layer 301-3 is a multiple quantum well (MQW) of InGaN/GaN, and the second semiconductor layer 301-4 is a P-type GaN layer, e.g., Mg-doped GaN layer. Moreover, as illustrated in FIG. 6A and FIG. 6B, the first light-emitting element 3011 and the repair light-emitting element 3012 further include electrode structures 301-6, respectively; and the first light-emitting element 3011 and the repair light-emitting element 3012 are secured on to the backplate 302 (see FIG. 7) through the electrode structures 310-6, respectively.

As illustrated in FIG. 6A, the electrode structure 301-6 of the first light-emitting element 3011 includes an Ohmic contact layer 301-61 and a first soldering layer 301-62. The Ohmic contact layer 301-61 is formed on the first semiconductor layer 301-2 and the second semiconductor layer 301-4, to form Ohmic contacts therewith. The first soldering layer 301-62 is formed over the Ohmic contact layer 301-61 on the first semiconductor layer 301-2 and the Ohmic contact layer 301-61 on the second semiconductor layer 301-4 and used to solder LED chips to pads on the backplate 302 (see FIG. 7), and thereby achieving electrical connections. The first soldering layer 301-62 is a multi-layer structure, and preferably, the multi-layer structure includes multiple single-metal layers. As illustrated in FIG. 6A, the first soldering layer 301-62 exemplarily includes a sixth single-metal layer 301-621 and a seventh single-metal layer 301-622. The sixth single-metal layer 301-621 and the seventh single-metal layer 301-622 are single-metal layers formed of different single-metals, and a melting point of the sixth single-metal layer 301-621 is higher than a melting point of the seventh single-metal layer 301-622. For example, the sixth single-metal layer 301-621 may be a metal layer of Sn, and the seventh single-metal layer 301-622 may be a metal layer of In.

As illustrated in FIG. 6B, the electrode structure 301-6 of the repair light-emitting element 3012 includes an Ohmic contact layer 301-61 and a second soldering layer 3012-62. The Ohmic contact layer 301-62 is formed on the first semiconductor layer 301-2 and the second semiconductor layer 301-4, to form Ohmic contacts therewith. The second soldering layer 3012-62 is formed on the Ohmic contact layer 301-61 on the first semiconductor layer 301-2 and the Ohmic contact layer 301-61 on the second semiconductor layer 310-4 and used to solder the repair light-emitting element 3012 to the repair pad on the backplate 302 (see FIG. 7), thereby achieving electrical connections. In an illustrated embodiment, the second soldering layer 3012-62 is a multi-layer structure, and preferably, the multi-layer structure includes multiple single-metal layers. As illustrated in FIG. 6B, the number of the multiple single-metal layers of the second soldering layer 3012-62 may be the same as the number of the multiple single-metal layers of the first soldering layer 301-62, and as exemplarily shown, the second soldering layer 3012-62 includes an eighth single-metal layer 3012-621 and a ninth single-metal layer 3012-622. In an illustrated embodiment, the eighth single-metal layer 3012-621 and the sixth single-metal layer 301-621 are single-metal layers formed of the same metal, and the ninth single-metal layer 3012-622 and the seventh single-metal layer 301-622 are single-metal layers formed of the same metal. For example, in the repair light-emitting element 3012, the eighth single-metal layer 3012-621 is a metal layer of Sn, and the ninth single-metal layer 3012-622 is a metal layer of In. Moreover, the single-metal layers formed of each the same metal have same stacking orders in the second soldering layer 3012-62 and the first soldering layer 301-62 respectively. In particular, as illustrated in FIG. 6A and FIG. 6B, in the direction gradually away from the Ohmic contact layer 301-61, the first soldering layer 301-62 has the sixth single-metal layer 301-621 and the seventh single-metal layer 301-622 sequentially stacked in that order, and the second soldering layer 3012-62 has the eighth single-metal layer 3012-621 and the ninth single-metal layer 3012-622 sequentially stacked in that order.

In an exemplary embodiment, a thickness ratio of a single-metal layer of high melting point to a single-metal layer of low melting point is in a range of 1:10-10:1. In order to obtain different soldering temperatures, the thickness ratio of the single-metal layer of high melting point in the first soldering layer 301-62 is a third thickness ratio, the thickness ratio of the single-metal layer of low melting point in the second soldering layer 3012-62 is a fourth thickness ratio, and the third thickness ratio is greater than the fourth thickness ratio. For example, the thickness ratio of the sixth single-metal layer 301-621 to the seventh single-metal layer 301-622 in the first soldering layer 301-62 is different from the fourth thickness ratio of the eighth single-metal layer 3012-621 to the ninth single-metal layer 3012-622 in the second soldering layer 3012-62, and the third thickness ratio of the sixth single-metal layer 301-621 to the seventh single-metal layer 301-622 is greater than the fourth thickness ratio of the eighth single-metal layer 3012-621 to the ninth single-metal layer 3012-622. In exemplary embodiments, the third thickness ratio is 10:1, and the fourth thickness ratio is 4:6; or, the third thickness ratio is 4:6, and the fourth thickness ratio is 1:10; or, the third thickness ratio is 8:1, and the fourth thickness ratio is 2:1; or, the third thickness ratio is 5:7, and the fourth thickness ratio is 3:8. The exemplarily listed thickness ratios represent different contents of different single-metal layers in the first soldering layer 301-62 or in the second soldering layer 3012-62. Since different metals have different melting points, by controlling to be with different thickness ratios, the first soldering layer 301-62 and the second soldering layer 3012-62 may be controlled to have different bonding temperatures, and the bonding temperature of the second soldering layer 3012-62 is lower than the bonding temperature of the first soldering layer 301-62.

Figure 7:
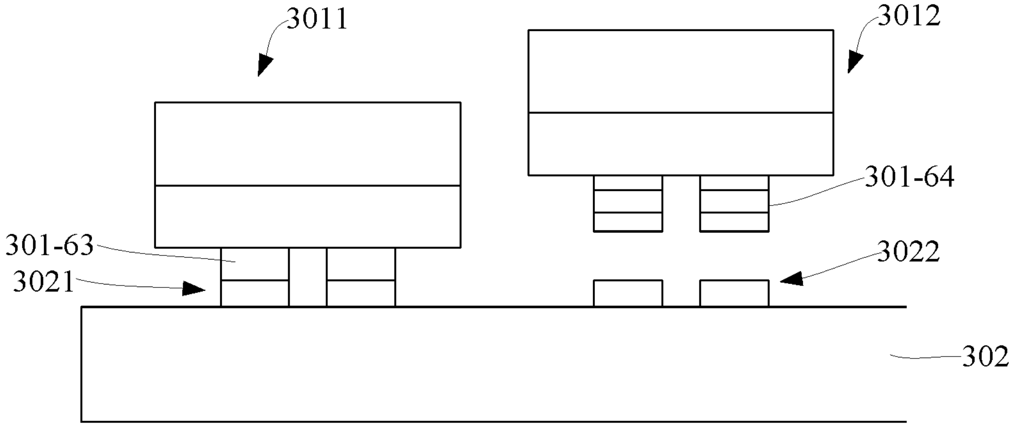
FIG. 7 illustrates a schematic view of soldering the light-emitting elements according to the embodiment 3 of the disclosure on a backplate.

As described above, the first soldering layer 301-62 of the first light-emitting element 3011 and the second soldering layer 3012-62 of the repair light-emitting element 3012 have the above structural features, and the structural features can make that the first soldering layer 301-62 and the second soldering layer 3012-62 have different bonding temperatures, and the bonding temperature of the second soldering layer 3012-62 is lower than the bonding temperature of the first soldering layer 301. As illustrated in FIG. 7, during soldering the light-emitting elements on the backplate 302, the first light-emitting element 3011 is first transferred to the first pad 3021 on the backplate 302. The first soldering layer 301-62 of the first light-emitting element 3011 has a relatively high temperature at which it starts to melt, e.g., 200° C. Therefore, when thermal bonding is performed on the first light-emitting element 3011, it is heated up to about 260° C., so as to ensure the first soldering layer 301-62 of the first light-emitting element 3011 is completely melted to form a third alloy 301-63, thereby realizing Sufficient thermal bonding of the first light-emitting element 3011. A melting temperature of the third alloy 301-63 formed by heating the first soldering layer 301-62 is about 200° C.

During soldering the repair light-emitting element 3012, the repair light-emitting element 3012 is heated first. Since the second soldering layer 3012-62 has a lower temperature at which it starts to melt, during the heating process, the second soldering layer 3012-62 is also completely melted and forms a fourth alloy 301-64. In view of the above structural designs of the second soldering layer 3012-62 and the first soldering layer 301-62, the fourth alloy 301-64 formed by the second soldering layer 3012-62 has a lower melting temperature than the third alloy 301-63 formed by the first soldering layer 301-62. In an illustrated embodiment, the melting temperature of the fourth alloy 304-64 is about 125° C. After forming the fourth alloy 301-64, the repair light-emitting element 3012 is transferred to the second pad 3022 serving as a repair pad on the backplate 302, and thermal bonding is performed again. At this time, the fourth alloy 301-64 is heated up to about 150° C. but below 200° C., which can ensure that the fourth alloy 301-64 is completely melted but the third alloy 301-63 formed by the first soldering layer 301-62 is not melted, thereby ensuring the first light emitting element 3011 will not be deviated or fall off while the repair light emitting element 3012 is fully bonded to the backplate 302.

In addition, in an illustrated embodiment, the multiple single-metal layers of each of the first soldering layer 301-62 and the second soldering layer 3012-62 are formed by an evaporation method. Such evaporation method uses single-metals as evaporation metal sources to obtain single-metal layers on the Ohmic contact layer 301-61. By selecting different evaporation metal sources to obtain different single-metal layers and accurately controlling thicknesses of the single-metal layers, multiple single-metal layers meeting the above structural requirements can be obtained consequently.

Figure 8:
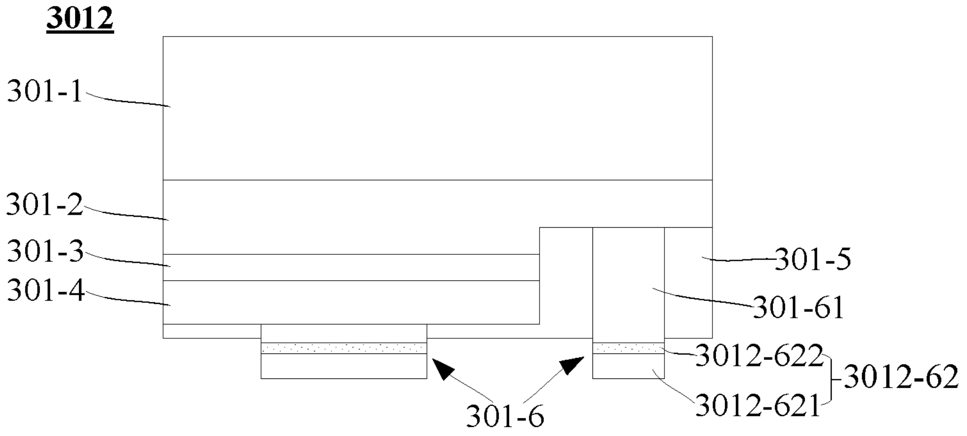
FIG. 8 illustrates a schematic structural view of another repair light-emitting element of the light-emitting elements according to the embodiment 3 of the disclosure.

In an embodiment, the first soldering layer 301-62 and the second soldering layer 3012-62 include same numbers of single-metal layers formed of same metals, and the single-metal layers formed by each same metal have different stacking orders in the first soldering layer 301-62 and the second soldering layer 3012-62 respectively. As illustrated in FIG. 8, in combination with FIG. 6A, the eighth single-metal layer 3012-621 of the second soldering layer 3012-62 and the sixth single-metal layer 301-621 of the first soldering layer 301-62 are single-metal layers formed of the same metal, the ninth single-metal layer 3012-622 of the second soldering layer 3012-62 and the seventh single-metal layer 301-622 of the first soldering layer 301-62 are single-metal layers formed of the same metal. For example, as described above, the sixth single-metal layer 301-621 and the eighth single-metal layer 3012-621 each may be a metal layer of Sn, and the seventh single-metal layer 301-622 and the ninth single-metal layer 3012-622 each may be a metal layer of In. However, in the illustrated embodiment, as shown in FIG. 8, the stacking orders of the eighth single-metal layer 3012-621 and the ninth single-metal layer 3012-622 in the second soldering layer 3012-62 are different from that of the sixth single-metal layer 301-621 and the seventh single-metal layer 301-622 in the first soldering layer 301-62. For example, as illustrated in FIG. 6A and FIG. 8, in the direction gradually away from the Ohmic contact layer 301-61, the first soldering layer 301-62 has the sixth single-metal layer 301-621 and the seventh single-metal layer 301-622 sequentially stacked in that order, and the second soldering layer 3012-62 has the ninth single-metal layer 3012-622 and the eighth single-metal layer 3012-621 sequentially stacked in that order. The stacking orders of the multiple single-metal layers can also meet the requirement of different bonding temperatures, while increasing design flexibility of the electrode structure 301-6.

As described above, the multiple metal layers of the first soldering layer 301-62 and the multiple metal layers of the second soldering layer 3012-62 are single-metal layers formed of multiple same metals. It can be understood that, according to the eutectic theory of metals, the first soldering layer 301-62 and the second soldering layer 3012-62 may include single-metal layers formed of different metals. For example, a forming material of at least one single-metal layer of the second soldering layer 3012-62 is different from a forming material of any single-metal layer of the first soldering layer 301-62. In exemplary embodiments, the first soldering layer 301-62 includes a Sn layer and a Zn layer, and the second soldering layer 3012-62 includes a Sn layer and an In layer; or, the first soldering layer 301-62 includes a Ag layer and a Zn layer, and the second soldering layer 3012-62 includes a Bi layer and a Sn layer; as long as the bonding temperature of the first soldering layer 301-62 is higher than the bonding temperature of the second soldering layer 3012-62.

Figure 9:
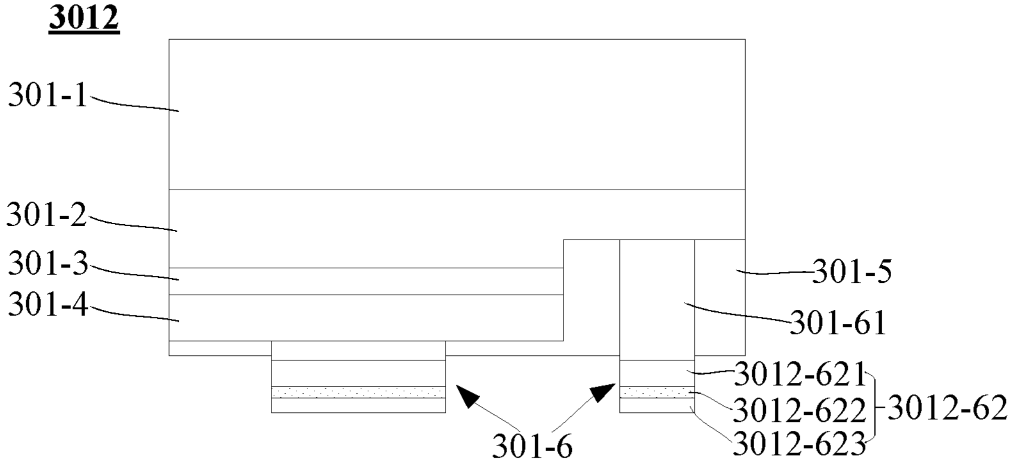
FIG. 9 illustrates a schematic structural view of still another repair light-emitting element of the light-emitting elements according to the embodiment 3 of the disclosure.

In an embodiment, the first soldering layer 301-62 and the second soldering layer 3012-62 have different numbers of single-metal layers, and the multiple single-metal layers of the first soldering layer 301-62 and the multiple single-metal layers of the second soldering layer 3012-62 may be multiple single-metal layers formed of multiple same metals or multiple single-metals formed of different metals. As illustrated in FIG. 9, in combination with FIG. 6A, the first soldering layer 301-62 includes the sixth single-metal layer 301-621 and the seventh single-metal layer 301-622, the second soldering layer 3012-62 includes an eighth single-metal layer 3012-621, a ninth single-metal layer 3012-622 and a tenth single-metal layer 3012-623. In an exemplary embodiment, the sixth single-metal layer 301-621 and the seventh single-metal layer 301-622 may be a Sn layer and an Ag layer respectively, the eighth single-metal layer 3012-621, the ninth single-metal layer 3012-622 and the ninth single-metal layer 3012-623 may be a Sn layer, an In layer and a Bi layer respectively.

In an illustrated embodiment, the multiple single-metal layers of the first soldering layer 301-62 and the multiple single-metal layers of the second soldering layer 3012-62 may be selected from the combinations listed in the above Table 1 of embodiment 1, and stacking orders thereof can be changed according to actual needs. Moreover, it can be understood that, the first soldering layer 301-62 may include three or more than three single-metal layers, the second soldering layer 3012-62 may include more than three single-metal layers, and multiple single-metal layers of the first soldering layer 301-62 and the multiple single-metal layers of the second soldering layer 3012-62 may be any arbitrary combinations under the condition of satisfying bonding temperatures.

Embodiment 4

Figure 10:
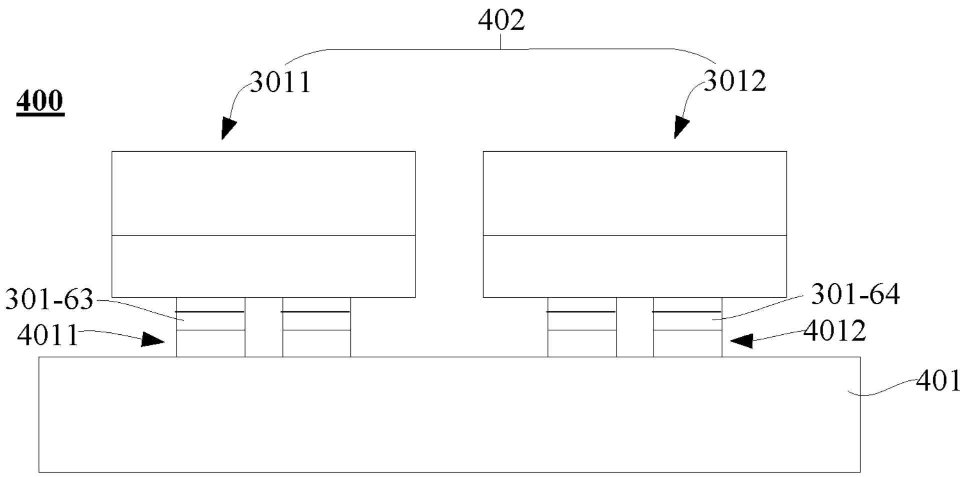
FIG. 10 illustrates a schematic structural view of a display panel according to embodiment 4 of the disclosure.

This embodiment provides a display panel. As illustrated in FIG. 10, the display panel 400 in this embodiment includes a backplate 401 and light-emitting elements 402 disposed on the backplate 401. Specifically, as shown in FIG. 10, the backplate 401 includes a first pad 4011 and a second pad 4012 formed on the backplate 401. The light-emitting elements 402 are the light-emitting elements provided in the above embodiment 3, that is, include the first light-emitting element 3011 secured on the first pad 4011. The display panel 400 further includes at least one repair light-emitting element 3012 secured onto at least one second pad 4012. In an illustrated embodiment, the first light-emitting element 3011 and the repair light-emitting element 3012 are soldered to the backplate 401 through the soldering process described in the embodiment 3 shown in FIG. 7. The first light-emitting element 3011 is secured to the first pad 4011 at the first bonding temperature through the third alloy 301-63 formed by heating the first bonding layer 301-62, and the repair light-emitting element 3012 is secured to the second pad 4012 at the second bonding temperature through the fourth alloy 301-64 formed by heating the second bonding layer 3012-62. As described above, the third alloy 301-63 is formed by heating the first soldering layer 301-62, the fourth alloy 301-64 is formed by heating the second soldering layer 3012-62, and the first soldering layer 301-62 and the second soldering layer 3012-62 have the structural designs described in the above embodiment 3. Therefore, the first bonding temperature is higher than the second bonding temperature. Accordingly, the bonding process of the repair light-emitting element 3012 does not affect the stability of the first light-emitting element 3011, thereby ensuring the overall yield of the display panel 400.

The above embodiments are merely illustrative of the principle and efficacy of the disclosure, and are not intended to limit the disclosure. Any person skilled in the art can modify or change the above embodiments without departing from the spirit and scope of the disclosure. Accordingly, all equivalent modifications and changes made by those skilled in the art without departing from the spirit and scope of the disclosure are covered by scope of protection of the appended claims.

What is claimed is:

1. A backplate, wherein a surface of the backplate is disposed with a first pad and a second pad configured to bond light-emitting elements, the second pad is configured as a repair pad, the first pad comprises a first adhesive layer and a first bonding layer, the second pad comprises a second adhesive layer and a second bonding layer, each of the first bonding layer and the second bonding layer is a multi-layer structure, the multiple-layer structure comprises a plurality of single-metal layers, and a bonding temperature of the first bonding layer is higher than a bonding temperature of the second bonding layer;

wherein the first pad further comprises a first connection electrode arranged on a side of the first adhesive layer facing away from the first bonding layer and thereby the first connection electrode is located between the backplate and the first adhesive layer, an area of orthographic projection of the first adhesive layer on the surface of the backplate is 1.15-2.5 times of an area of orthographic projection of the first connection electrode on the surface of the backplate, and the area of orthographic projection of the first adhesive layer on the surface of the backplate is 1.15-2.5 times of an area of orthographic projection of the first bonding layer on the surface of the backplate; and/or wherein the second pad further comprises a second connection electrode arranged on a side of the second adhesive layer facing away from the second bonding layer and thereby the second connection electrode is located between the backplate and the second adhesive layer, an area of orthographic projection of the second adhesive layer on the surface of the backplate is 1.15-2.5 times of an area of orthographic projection of the second connection electrode on the surface of the backplate, and the area of orthographic projection of the second adhesive layer on the surface of the backplate is 1.15-2.5 times of an area of orthographic projection of the second bonding layer on the surface of the backplate.

2. The backplate as claimed in claim 1, wherein a number of the plurality of single-metal layers of the first bonding layer is equal to that of the plurality of single-metal layers of the second bonding layer.

3. The backplate as claimed in claim 2, wherein the plurality of single-metal layers of the first bonding layer comprise at least two single-metal layers formed of different metals, the plurality of single-metal layers of the second bonding layer comprise at least two single-metal layers formed of different metals.

4. The backplate as claimed in claim 1, wherein a number of the plurality of single-metal layers of the first bonding layer is different from that of the plurality of single-metal layers of the second bonding layer.

5. The backplate as claimed in claim 4, wherein the plurality of single-metal layers of the first bonding layer comprise at least two single-metal layers formed of different metals, the plurality of single-metal layers of the second bonding layer comprise at least two single-metal layers formed of different metals.

6. The backplate as claimed in claim 1, wherein the plurality of single-metal layers of the first bonding layer comprise at least two single-metal layers formed of different metals, the plurality of single-metal layers of the second bonding layer comprise at least two single-metal layers formed of different metals.

7. The backplate as claimed in claim 6, wherein the plurality of single-metal layers of each of the first bonding layer and the second bonding layer comprise sequentially stacked single-metal layers formed of a first metal and a second metal, and a melting point of the first metal is higher than that of the second metal.

8. The backplate as claimed in claim 7, wherein a thickness ratio of the single-metal layer formed of the first metal to the single-metal layer formed of the second metal is in a range of 1:10-10:1.

9. The backplate as claimed in claim 8, wherein the thickness ratio of the single-metal layer formed of the first metal to the single-metal layer formed of the second metal in the first bonding layer is a first thickness ratio, the thickness ratio of the single-metal layer formed of the first metal to the single-metal layer formed of the second metal in the second bonding layer is a second thickness ratio, and the first thickness ratio is greater than the second thickness ratio to make the bonding temperature of the first bonding layer is higher than the bonding temperature of the second bonding layer.

10. The backplate as claimed in claim 7, wherein stacking orders of the first metal and the second metal in the plurality of single-metal layers of the first bonding layer are different from that of the first metal and the second metal in the plurality of single-metal layers of the second bonding layer.

11. The backplate as claimed in claim 7, wherein stacking orders of the first metal and the second metal in the plurality of single-metal layers of the first bonding layer are the same as that of the first metal and the second metal in the plurality of single-metal layers of the second bonding layer.

12. The backplate as claimed in claim 6, wherein a forming material of at least one single-metal layer of the plurality of single-metal layers of the second bonding layer is different from a forming material of any single-metal layer of the plurality of single-metal layers of the first bonding layer.

13. The backplate as claimed in claim 1, wherein the first pad is configured to bond a first light-emitting element of the light-emitting elements, and the second pad is configured to bond a repair light-emitting element of the light-emitting elements, during a primary bonding process of the first light-emitting element, the first bonding layer is configured to be melted to form a first alloy and the second bonding layer is configured to be melted to form a second alloy; and during a secondary repair bonding process of the repair light-emitting element after the primary bonding process, the second alloy is configured to be completely melted while the first alloy is configured to be not melted.

14. A backplate, wherein a surface of the backplate is disposed with a first pad and a second pad configured to bond light-emitting elements, the second pad is configured as a repair pad, the first pad comprises a first adhesive layer and a first bonding layer, the second pad comprises a second adhesive layer and a second bonding layer, each of the first bonding layer and the second bonding layer is a multi-layer structure, the multiple-layer structure comprises a plurality of single-metal layers, the plurality of single-metal layers comprise at least two single-metal layers formed of different metals, the at least two single-metal layers comprise sequentially stacked single-metal layers formed of a first metal and a second metal, a melting point of the first metal is higher than that of the second metal, a thickness ratio of the single-metal layer formed of the first metal to the single-metal layer formed of the second metal in the first bonding layer is a first thickness ratio, a thickness ratio of the single-metal layer formed of the first metal to the single-metal layer formed of the second metal in the second bonding layer is a second thickness ratio, and the first thickness ratio is greater than the second thickness ratio thereby making a bonding temperature of the first bonding layer is higher than a bonding temperature of the second bonding layer;

wherein the first pad further comprises a first connection electrode arranged on a side of the first adhesive layer facing away from the first bonding layer and thereby the first connection electrode is located between the backplate and the first adhesive layer, the first adhesive layer further extends onto two opposite side surfaces of the first connection electrode along a direction facing towards the backplate, and an area of orthographic projection of the first adhesive layer on the surface of the backplate is greater than an area of orthographic projection of the first connection electrode on the surface of the backplate.

15. The backplate as claimed in claim 14, wherein the area of orthographic projection of the first adhesive layer on the surface of the backplate is greater than an area of orthographic projection of the first bonding layer on the surface of the backplate.

16. The backplate as claimed in claim 14, wherein an area of orthographic projection of the second adhesive layer on the surface of the backplate is greater than an area of orthographic projection of the second bonding layer on the surface of the backplate, and the second adhesive layer extends onto two opposite side surfaces of the second bonding layer along a direction facing away from the backplate.

17. A backplate, wherein a surface of the backplate is disposed with a first pad and a second pad configured to bond light-emitting elements, the second pad is configured as a repair pad, the first pad comprises a first adhesive layer and a first bonding layer, the second pad comprises a second adhesive layer and a second bonding layer, each of the first bonding layer and the second bonding layer is a multi-layer structure, the multiple-layer structure comprises a plurality of single-metal layers, the plurality of single-metal layers comprise at least two single-metal layers formed of different metals, the at least two single-metal layers comprise sequentially stacked single-metal layers formed of a first metal and a second metal, a melting point of the first metal is higher than that of the second metal, a thickness ratio of the single-metal layer formed of the first metal to the single-metal layer formed of the second metal in the first bonding layer is a first thickness ratio, a thickness ratio of the single-metal layer formed of the first metal to the single-metal layer formed of the second metal in the second bonding layer is a second thickness ratio, and the first thickness ratio is greater than the second thickness ratio thereby making a bonding temperature of the first bonding layer is higher than a bonding temperature of the second bonding layer;

wherein the second pad further comprises a second connection electrode arranged on a side of the second adhesive layer facing away from the second bonding layer and thereby the second connection electrode is located between the backplate and the second adhesive layer, the second adhesive layer further extends onto two opposite side surfaces of the second connection electrode along a direction facing towards the backplate, and an area of orthographic projection of the second adhesive layer on the surface of the backplate is greater than an area of orthographic projection of the second connection electrode on the surface of the backplate.

18. The backplate as claimed in claim 17, wherein the area of orthographic projection of the second adhesive layer on the surface of the backplate is greater than an area of orthographic projection of the second bonding layer on the surface of the backplate.

19. The backplate as claimed in claim 17, wherein an area of orthographic projection of the first adhesive layer on the surface of the backplate is greater than an area of orthographic projection of the first bonding layer on the surface of the backplate, and the first adhesive layer extends onto two opposite side surfaces of the first bonding layer along a direction facing away from the backplate.

* * * * *